(12) United States Patent
Lee

(10) Patent No.: US 6,819,176 B1
(45) Date of Patent: Nov. 16, 2004

(54) HIGH POWER, WIDE BANDWIDTH OPERATIONAL AMPLIFIER

(75) Inventor: Jerold Lee, Los Altos, CA (US)

(73) Assignee: Remec, Inc., Del Mar, CA (US)

( * ) Notice: Subject to any disclaimer, the term of this patent is extended or adjusted under 35 U.S.C. 154(b) by 0 days.

(21) Appl. No.: 10/617,463

(22) Filed: Jul. 11, 2003

(51) Int. Cl.[7] .................................................. H03F 1/00
(52) U.S. Cl. .................. 330/151; 330/124 R; 330/295; 330/292; 330/279
(58) Field of Search ............................. 330/151, 124 R, 330/295, 292, 279, 280

(56) References Cited

U.S. PATENT DOCUMENTS 4,528,519 A * 7/1985 van Driest .................. 330/279

\* cited by examiner

Primary Examiner—Michael B Shingleton
(74) Attorney, Agent, or Firm—Allen, Dyer, Doppelt, Milbrath & Gilchrist, P.A.

(57) ABSTRACT

A high bandwidth operational amplifier architecture has three control loops, which are combined via a voltage-follower-configured field effect transistor. The first control loop is an instantaneous main amplification path and employs positive feedback-based Vgs correction of the output transistor. The second control loop has a bandwidth considerably lower than the first loop and employs negative feedback to correct for long term drift errors. The third control loop, utilizing negative feedback, is a fast path having a bandwidth that overlaps the bandwidth of the first control loop, and corrects for overshoot and undershoot in the main amplification path.

18 Claims, 1 Drawing Sheet

HIGH POWER, WIDE BANDWIDTH OPERATIONAL AMPLIFIER

FIELD OF THE INVENTION

The present invention relates in general to communication systems and components therefor, and is particularly directed to a new and improved, multiple control loop-based high power operational amplifier architecture, that has particular utility in digital code modulation amplification applications.

BACKGROUND OF THE INVENTION

Spectral regrowth is a common problem in present day transmitters employed for digital modulation applications, which may operate at a relatively high peak to average power ratio on the order of 8–10 dB. In high power communication systems, this can place a very high demand on a transmitter which is designed to provide an output power on the order of 40 watts. Over the past decade a number of techniques have been pursued in an effort to reduce this peak to average ratio. One approach, known as feed-forward cancellation, installs an auxiliary amplifier in a feed-forward cancellation loop in an effort to remove intermodulation distortion produces (IMDs) generated in the main power amplifier. Practice has shown that this type of distortion cancellation scheme has reached its practical limits since the correction amplifier has to be high power to maintain good linearity.

An alternative approach, known as predistortion, inserts a predistorting vector modulator in the input path to the main power amplifier, the predistorting vector modulator operating on the AM/AM and AM/PM properties of the power amplifier. Under high load conditions the AM/AM and AM/PM properties change dynamically with variations in input power. Further enhancements for predistortion techniques may include some form of feedback to minimize the AM/AM and AM/PM effects. Despite these improvements, the power amplifier's operating condition is not optimal for power added efficiency. This burdens the power amplifier's output power requirement.

A new approach involves operating the transmitter amplifier at saturation and using polar modulation, with phase information is imparted to the transmitter input, and amplitude modulation imparted to the drain of the amplifier's output (field effect) transistor. This serves to align the amplitude and phase components, and restore the composite digital signal at the amplifier output. Unfortunately, applications in which amplitude modulators have been employed to date have been limited to constant envelope signals. The evolution for high bandwidth and high power high linearity video amplifiers have prevented the use of this technique. For decades, the telecommunication industry has been focus on handset technology for low power and low voltage devices based on CMOS process. Recent advancements for DSL, ADSL, ADSL+, devices has evolved higher voltage and higher bandwidth devices using BiCMOS process. These devices still falter for base station applications where the output voltage and output power is too low. It will be readily appreciated, therefore, that there is currently a need for a high power wide bandwidth amplitude modulator, particularly one that is capable of driving complex loads without suffering from phase margin degradation.

SUMMARY OF THE INVENTION

To meet this need, the present invention is directed to a multi-feedback loop operational amplifier architecture, comprised of a set of three control loops, which are combined via a voltage-follower-configured field effect transistor output stage. The first control loop serves as an instantaneous main amplification path of the amplifier and provides positive feedback-based Vgs correction of voltage-follower configured output field effect transistor. In order to compensate for the Vgs offset component, the first control loop extracts the Vgs offset and feeds the extracted Vgs offset over a positive feedback path to a signal summer at the input of the main amplification path. As a result of this Vgs extraction and positive feedback operation, the signal at the output of the voltage follower corresponds exactly to the signal applied to the gate of the output field effect transistor, but without the effect of Vgs offset voltage.

Although the positive feedback path of the first control loop serves to compensate for the Vgs offset, it is not perfect, due to hole trapping and electron migration in the field effect transistor, which factors tend to build up charge and produce errors in its Vgs component. The effects of these errors are best described as amplifier drooping and peaking which re-circulates through the feedback loop and mask itself as a cyclic oscillatory condition. Absolute error correction is through the use of additional loops. The second and third loops correct for these errors through respective 'slow' and 'fast', time zone correction paths. In particular, the second control loop, which has a bandwidth considerably lower than the first and third loops corrects for long term drift errors, while the third control loop, which has a bandwidth that overlaps the bandwidth of the first control loop, compensates for ringing in the main amplification path.

BRIEF DESCRIPTION OF THE DRAWINGS

The single FIGURE is a diagrammatic illustration of a high power, wideband amplifier in accordance with a preferred embodiment of the invention.

DETAILED DESCRIPTION

Figure 1:
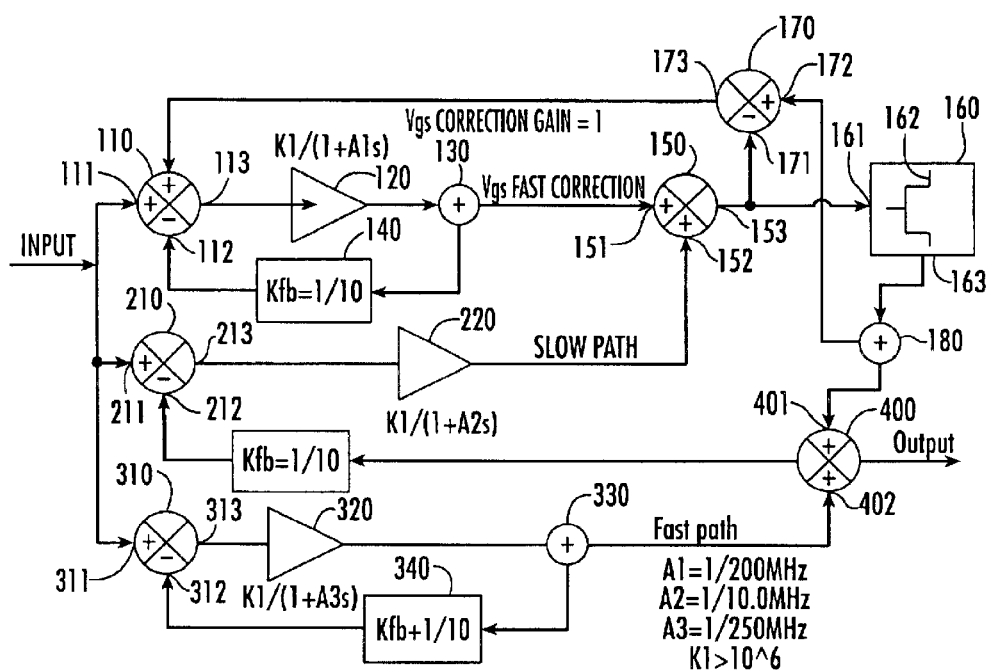

Before describing in detail the high power wideband amplifier architecture of the present invention, it should be observed that the invention resides primarily in a prescribed modular arrangement of conventional communication circuits and components. In a practical implementation that facilitates its being packaged in a hardware-efficient configuration, this modular arrangement may be readily implemented as an application specific integrated circuit (ASIC) chip set. Consequently, the configuration of such arrangement of circuits and components and the manner in which they are interfaced with other communication equipment have been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration is primarily intended to show the major components of the invention in a convenient functional grouping, whereby the present invention may be more readily understood.

Attention is now directed to the single FIGURE, wherein a preferred, but non-limiting, embodiment of the present invention is diagrammatically illustrated as comprising an input port 11, to which a digital communication signal to be amplified by a prescribed gain factor (e.g., G=10) is applied. Input port 11 is coupled to a set of three control loops 100, 200 and 300. The first control loop 100 serves as the effectively instantaneous main amplification path of the amplifier and provides positive feedback-based Vgs correction of an output FET 160.

For this purpose control loop 100 has a first, non-inverting (+) input 111 of a first signal combiner 110 coupled to the input port 11. Signal combiner 110 has its output 115 coupled to a first amplification gain stage 120 having a transfer function multiplier $K1/(1+A1s)$, where $K1>10^6$, and A1 has a relatively high inverse bandwidth ratio, such as 1/200 MHz. From a node 130, the output of gain stage 120 is fed back via a gain factor stage 140 to a second, inverting (−) input 112 of the first signal combiner 110. As shown, for the present example of a gain of G=10, the gain factor stage 140 has a gain scaling factor of Kfb=1/10.

Node 130 is further coupled to a first input 151 of a second signal combiner 150, the output 153 of which is coupled to the gate 161 of a voltage follower-configured output field effect transistor (PET) stage 160, and to a first, inverting (−) input 171 of error stage 170. FET 160 has its drain 162 coupled to a prescribed bias voltage and its source 163 coupled via a node 180 to a first input 401 of an output signal combiner 400. Node 180 is representative of the gate voltage of FET 160 minus a gate-source offset voltage component Vgs. In order to compensate for this Vgs offset component, node 170 is further coupled to a second, non-inverting (+) input 172 of error stage 170, wherein the VGS offset is extracted from the signal applied to the FET's gate 161 and fed back over a positive feedback path to a third, non-inverting (+) input 113 of signal combiner 110. As a result of this Vgs extraction and positive feedback operation, the signal at node 170 corresponds to the signal applied to the gate of the output FET 160, but without the effect of Vgs offset voltage. Unfortunately, the removal of the Vgs component (which varies with load current) is not absolute, due to hole trapping and electron migration in the FET 160, which tend to build up charge and produce errors in its Vgs component. The second and third loops 200 and 300 correct for these errors through respective 'slow' and 'fast' time zone correction paths.

The slow control loop 200 corrects for long term drift errors (such as those associated with variation is semiconductor processing of the FET 160), and comprises a signal combiner 210 to a first input 211 of which the input 11 is coupled. The signal combiner 210 is coupled to an operational amplifier gain stage 220 having a transfer function multiplier $K1/(1+A2s)$, where A2 has a relatively low inverse bandwidth ratio, e.g., on the order of 1/10 MHz, so that the slow control loop has a bandwidth on the order of decade lower than the first control loop. The output of gain stage 220 is coupled to a second, non-inverting (+) input 152 of signal combiner 150, which feeds the gate 161 of the FET stage, as described above. In order to correct for long term drift, the composite out of signal combiner 400 is fed back through a gain factor scaling (Kb=1/10) stage 240 to the inverting (−) input 212 of signal combiner 210.

The fast correction loop 300 corrects for overshoot and undershoot in the main amplification path 100 and comprises a signal combiner 310 to a first input 311 of which the input 11 is coupled. The signal combiner 310 has its output 313 coupled to an operational amplifier gain stage 320 having a transfer function multiplier $K1/(1+A3s)$, where A3 has a relatively high inverse bandwidth ratio, e.g., on the order of 1/250 MHz. From a node 330, the output of gain stage 320 is fed back via a gain factor (Kb=10) stage 340 to a second, inverting (−) input 312 of the signal combiner 310. Node 330 is further coupled to a second input 402 of output signal combiner 400.

As will be appreciated from the foregoing description, the desire for a high power wide bandwidth amplitude modulator that is capable of driving complex loads without suffering from phase margin degradation is effectively realized by the multi-feedback loop operational amplifier architecture of the present invention. By combining three control loops feeding a voltage-follower-configured field effect transistor output stage, the invention is not only able to perform instantaneous amplification of the input signal, but is able to compensate for the output transistor's Vgs offset component.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. An amplifier architecture comprising:

an input port to which a signal to be amplified is coupled;

an output port from which an amplified signal is derived;

a first amplification path coupled between said input port and said output port and including a first gain stage and an output transistor having a control input terminal coupled to said first gain stage and an output terminal coupled to said output port, said first amplification path being operative to compensate for an offset voltage component in said amplified signal associated with said output transistor;

a second amplification path coupled between said input port and said output port and being operative to correct for long term drift errors in said main amplification path; and a third amplification path coupled between said input port and said output port and being operative to correct for high frequency transient effects in said main amplification path.

2. The amplifier architecture according to claim 1, wherein said output transistor comprises a source follower-configured field effect transistor.

3. The amplifier architecture according to claim 2, wherein said first amplification path is operative to compensate for a gate-to-source voltage offset component in said amplified signal associated with said field effect transistor.

4. The amplifier architecture according to claim 1, wherein said first amplification path includes a positive feedback loop coupled between said output transistor and said input port, and being operative to feed back a voltage representative of said offset voltage to said input port, so as to be combined with said signal to be amplified and applied to said first gain stage.

5. The amplifier architecture according to claim 4, wherein said second amplification path includes a negative feedback loop coupled between said output port and said input port, and being operative to feed back said amplified signal to said input port, so as to be combined with said signal to be amplified and being applied to a second gain stage, said second gain stage having an output thereof combined with the output of said first gain stage for application to said control electrode of said transistor.

6. The amplifier architecture according to claim 5, wherein said third amplification path includes a fast path coupled between said input port and said output port, and being operative to amplify said input signal by way of a third gain stage, said third gain stage having an output thereof coupled to said output port, so as to be combined with signals amplified by said first and second gain stages and provided at said output terminal of said output transistor.

7. The amplifier architecture according to claim 6, wherein said third amplification path has a bandwidth that overlaps the bandwidth of said first amplification path.

8. The amplifier architecture according to claim 7, wherein said second amplification loop has a bandwidth on the order of decade lower than bandwidths of said first and third amplification loops.

9. An amplifier architecture comprising:
   an input port to which a signal to be amplified is coupled;
   an output port from which an amplified signal is derived;
   a first amplification path coupled between said input port and said output port and including a first gain stage;
   an output transistor coupled in voltage follower configuration having a control terminal coupled to said first gain stage and an output terminal coupled to said output port;
   a first, positive feedback compensation loop, coupled between said output transistor and said input port, and being operative to feed back a voltage representative of an offset voltage between said control terminal and said output terminal to said input port, so as to be combined with said signal to be amplified and applied to said first gain stage, and compensate for said offset voltage in said amplified signal;
   a second, negative feedback loop, coupled between said output port and said input port, and being operative to feed back said amplified signal to said input port, so as to be combined with said signal to be amplified and being applied to a second gain stage, said second gain stage having an output thereof combined with the output of said first gain stage for application to said control electrode of said transistor; and
   a third, fast path utilizing negative feedback coupled between said input port and said output port, and being operative to amplify said input signal by way of a third gain stage, said third gain stage having an output thereof coupled to said output port, so as to be combined with signals amplified by said first and second gain stages and provided at said output terminal of said output transistor.

10. The amplifier architecture according to claim 9, wherein said output transistor comprises a source follower-configured field effect transistor.

11. The amplifier architecture according to claim 10, wherein said first, positive feedback loop is operative to compensate for a gate-to-source voltage offset component in said amplified signal associated with said field effect transistor.

12. The amplifier architecture according to claim 9, wherein said third loop has a bandwidth that overlaps the bandwidth of said first loop.

13. The amplifier architecture according to claim 9, wherein said second, negative feedback loop has a bandwidth on the order of decade lower than bandwidths of said first and third loops.

14. A method of controlling the operation of a voltage follower-configured output transistor having a control electrode thereof coupled to receive a signal to be amplified thereby and an output electrode thereof providing an amplified signal, said method comprising the steps of:

(a) coupling a signal to be amplified to a first gain stage an output of which is coupled to said control electrode;

(b) combining a voltage representative of an offset voltage between said control electrode and said output electrode with said signal to be amplified so as to compensate for said offset voltage in said amplified signal;

(c) differentially combining said amplified signal with said signal to be amplified via a second gain stage to produce a difference signal and coupling said difference signal with the output of said first gain stage for application to said control electrode of said transistor; and (d) coupling said signal to be amplified to a third gain stage an output of which is coupled to said output port and combined thereby with said amplified signal.

15. The method according to claim 14, wherein said output transistor comprises a source follower-configured field effect transistor.

16. The method according to claim 14, wherein said second gain stage has a bandwidth on the order of decade lower than bandwidths of said first and third gain stages.

17. The method according to claim 14, wherein said third gain stage has a bandwidth that overlaps the bandwidth of said first gain stage.

18. The method according to claim 14, wherein said third gain stage provides for instantaneous correction at the combined output of step (d).

\* \* \* \* \*